(12) United States Patent
Kim et al.

(10) Patent No.: US 9,159,950 B2
(45) Date of Patent: Oct. 13, 2015

(54) ORGANIC LIGHT EMITTING DISPLAY DEVICE AND METHOD FOR MANUFACTURING THE SAME

(71) Applicant: Samsung Display Co., Ltd., Yongin, Gyeonggi-Do (KR)

(72) Inventors: Hun Kim, Yongin (KR); Jin-Woo Park, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 106 days.

(21) Appl. No.: 13/924,272

(22) Filed: Jun. 21, 2013

(65) Prior Publication Data

US 2014/0291617 A1 Oct. 2, 2014

(30) Foreign Application Priority Data

Mar. 27, 2013 (KR) .................. 10-2013-0033084

(51) Int. Cl.
*H01L 29/08* (2006.01)
*H01L 51/52* (2006.01)
*H01L 51/56* (2006.01)

(52) U.S. Cl.
CPC ........ *H01L 51/5253* (2013.01); *H01L 51/5237* (2013.01); *H01L 51/5262* (2013.01); *H01L 51/56* (2013.01)

(58) Field of Classification Search
CPC ............ H01L 51/5237; H01L 51/5262; H01L 51/5253; H01L 51/56
USPC ........................................................... 257/40
See application file for complete search history.

(56) References Cited

U.S. PATENT DOCUMENTS

| 7,498,605 B2 | 3/2009 | Koo et al. | |
| 7,722,929 B2 | 5/2010 | Aitken et al. | |
| 2008/0006819 A1* | 1/2008 | McCormick et al. | 257/40 |
| 2013/0210199 A1* | 8/2013 | Chen et al. | 438/127 |

FOREIGN PATENT DOCUMENTS

KR 10-2005-0012958 A 2/2005

* cited by examiner

*Primary Examiner* — Douglas Menz
(74) *Attorney, Agent, or Firm* — Knobbe Martens Olson & Bear LLP

(57) ABSTRACT

In an aspect, an organic light emitting display device is provided. The organic light emitting display device may include a substrate; an organic light emitting unit arranged on the substrate; at least one inorganic layer, which encapsulates the organic light emitting unit and contains a low temperature viscosity transition (LVT) inorganic material; and at least one adhesive layer arranged between the organic light emitting unit and the inorganic layer.

15 Claims, 6 Drawing Sheets

ORGANIC LIGHT EMITTING DISPLAY DEVICE AND METHOD FOR MANUFACTURING THE SAME

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0033084, filed on Mar. 27, 2013, in the Korean Intellectual Property Office, the disclosure of which is incorporated herein in its entirety by reference.

BACKGROUND

1. Field

This disclosure relates to an organic luminescence emitting display device and a method for manufacturing the same, and more particularly, to an organic luminescence emitting display having excellent encapsulation characteristics and a method of manufacturing the same.

2. Description of the Related Technology

An organic light emitting display device is a self-luminescent type display device including an organic light emitting device including a hole injection electrode, an electron injection electrode, and an organic light emitting layer formed therebetween, where the organic light emitting display device emits light as excitons, which are generated as holes injected by the hole injection electrode and electrons injected by the electron injection electrode are combined at the organic light emitting layer, are switched from excited state to ground state.

Generally, an organic light emitting display is a self-luminescent type display device requiring no separate light source. Thus, the organic light emitting display device may be driven with a low voltage, may be embodied as a thin and lightweight display device, and may feature a wide viewing angle, high contrast, and fast response. Therefore, an organic light emitting display device is of interest as a next-generation display device.

An encapsulation structure for encapsulating the organic light emitting display device from the external environment is required since the device is vulnerable to external influences, such as oxygen and moisture.

Furthermore, a thin organic light emitting display and/or a flexible organic light emitting display are in demand for a variety of applications.

SUMMARY

The present disclosure provides an organic light emitting display device having excellent encapsulation characteristics and a method of manufacturing the same.

According to an aspect of the present disclosure, there is provided an organic light emitting display device including a substrate; an organic light emitting unit on the substrate; at least one inorganic layer, which encapsulates the organic light emitting unit and contains a low temperature viscosity transition (LVT) inorganic material; and at least one adhesive layer between the organic light emitting unit and the inorganic layer.

In some embodiments, the adhesive layer may include a metal.

In some embodiments, the coefficient of thermal expansion (CTE) of the adhesive layer may be smaller than CTE of the inorganic layer.

In some embodiments, the adhesive layer includes at least one selected from a group consisting of Au, Pt, Ag, Fe, Cu, Al, Y, and $Y_2O_3$.

In some embodiments, the thickness of the adhesive layer may be from about 3 nm to about 7 nm.

In some embodiments, the LVT inorganic material may include a tin oxide.

In some embodiments, the LVT inorganic material may include a tin oxide and further includes at least one selected from among a phosphorus oxide, boron phosphate, a tin fluoride, a niobium oxide, and a tungsten oxide.

In some embodiments, the LVT inorganic material may include SnO and further includes at least one selected from among $P_2O_5$, $BPO_4$, $SnF_2$, NbO, or $WO_3$.

In some embodiments, the viscosity transition temperature of the LVT inorganic material included in the inorganic layer may be lower than denaturation temperature of the organic light emitting unit.

In some embodiments, the organic light emitting display device further includes a barrier layer between the organic light emitting unit and the adhesive layer.

In some embodiments, the barrier layer may include at least one from between an oxide or a nitride.

In some embodiments, the barrier layer includes at least one selected from a group consisting of $SiO_x$ ($1 \leq x \leq 2$), $Al_2O_3$, zinc tin oxide (ZTO), Ga-doped zinc oxide (GZO), Al-doped zinc oxide (AZO), silicon oxynitride (SiON), and $SiN_x$ ($1 \leq x \leq 2$).

According to another aspect of the present embodiments, there is provided an organic light emitting display device including a substrate; an organic light emitting unit on the substrate; a first inorganic layer, which covers the organic light emitting unit and includes a first LVT inorganic material; a second inorganic layer, which is arranged on the first inorganic layer and includes a second LVT inorganic material; and an adhesive layer arranged between the first inorganic layer and the second inorganic layer.

In some embodiments, the adhesive layer may include a metal.

In some embodiments, the thickness of the adhesive layer may be from about 3 nm to about 7 nm.

In some embodiments, the first LVT inorganic material includes $SnO_2$, and the second LVT inorganic material includes SnO.

In some embodiments, the viscosity transition temperatures of the first LVT inorganic material and the second LVT inorganic material are lower than denaturation temperature of the organic light emitting unit.

According to another aspect of the present embodiments, there is provided a method of manufacturing an organic light emitting display device, the method including forming an organic light emitting unit on a substrate; forming at least one inorganic layer, which covers the organic light emitting unit and contains a low temperature viscosity transition (LVT) inorganic material; and forming at least one adhesive layer between the organic light emitting unit and the inorganic layer.

In some embodiments, the adhesive layer may include a metal.

In some embodiments, the adhesive layer may be formed via thermal evaporation, sputtering, vacuum deposition, cold deposition, electron beam coating, ion plating, or a combination thereof.

In some embodiments, the forming of the inorganic layer may include forming a pre-inorganic layer by providing the LVT inorganic material onto the organic light emitting unit; and restoring the pre-inorganic layer by thermally treating the pre-inorganic layer at a temperature higher than viscosity transition temperature of the LVT inorganic material.

In some embodiments, the viscosity transition temperature of the LVT inorganic material included in the inorganic layer is lower than denaturation temperature of the organic light emitting unit.

In some embodiments, the pre-inorganic layer may be restored by thermally treating the pre-inorganic layer at a temperature lower than denaturation temperature of a material included in the organic light emitting unit.

In some embodiments, the restoring of the pre-inorganic layer may be performed under vacuum atmosphere or inert gas atmosphere.

In some embodiments, the method further includes a barrier layer between the organic light emitting unit and the adhesive layer.

In some embodiments, the barrier layer may include at least one selected from a group consisting of $SiO_x$ ($1 \le x \le 2$), $Al_2O_3$, zinc tin oxide (ZTO), Ga-doped zinc oxide (GZO), Al-doped zinc oxide (AZO), silicon oxynitride (SiON), and $SiN_x$ ($1 \le x \le 2$).

In some embodiments, the barrier layer may be formed via thermal evaporation, sputtering, vacuum deposition, cold deposition, electron beam coating, or ion plating.

BRIEF DESCRIPTION OF THE DRAWINGS

The above and other features and advantages of the embodiments of the present disclosure will become more apparent by describing in detail exemplary embodiments thereof with reference to the attached drawings in which.

DETAILED DESCRIPTION

Figure 1A:
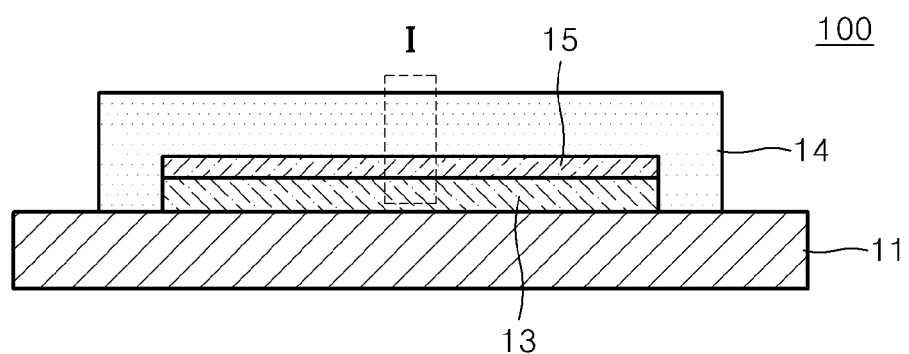
FIG. 1A is a schematic sectional view of an organic light emitting display device according to an embodiment.

As used herein, the term "and/or" includes any and all combinations of one or more of the associated listed items.

The present embodiments will now be described more fully with reference to the accompanying drawings, in which exemplary embodiments are shown. Like reference numerals in the drawings denote like elements, and thus their description will be omitted. In the drawings, the thicknesses of layers and regions are exaggerated for clarity.

The present embodiments may, however, be embodied in many different forms and should not be construed as being limited to the exemplary embodiments set forth herein; rather, these exemplary embodiments are provided to convey the concept of the present embodiments to those skilled in the art. It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

The terms used in the present specification are merely used to describe particular embodiments, and are not intended to be limiting. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. While such terms as "first," "second," etc., may be used to describe various components, such components must not be limited to the above terms. The above terms are used only to distinguish one component from another.

Figure 1B:
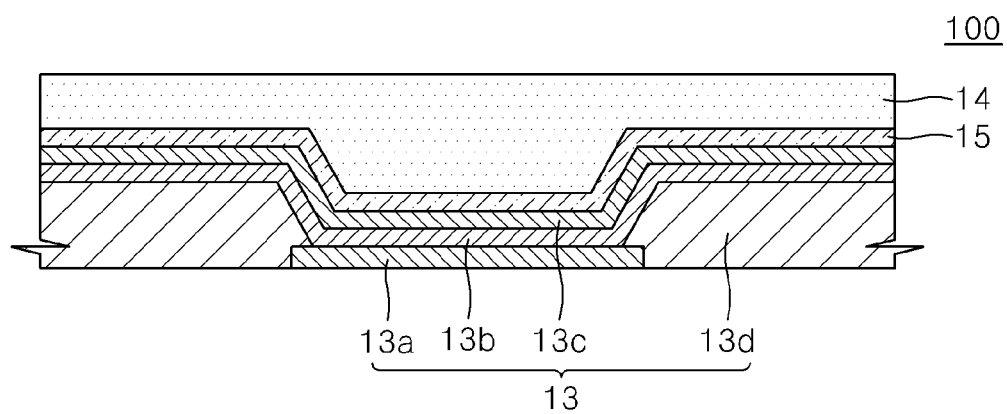
FIG. 1B is a sectional view showing the portion I of FIG. 1A.

FIG. 1A is a schematic sectional view of an organic light emitting display device 100 according to an embodiment, and FIG. 1B is a sectional view showing the portion I of FIG. 1A.

Referring to FIGS. 1A and 1B, the organic light emitting display device 100 includes a substrate 11, a organic light emitting unit 13 arranged on the substrate 11, at least one inorganic layer 14, which encapsulates the organic light emitting unit 13 and includes a low temperature viscosity transition (LVT) inorganic material, and at least one adhesive layer 15 interposed between the organic light emitting unit 13 and the inorganic layer 14.

In some embodiments, the substrate 11 may be formed of a $SiO_2$-based transparent glass. However, materials for forming the substrate 11 are not limited thereto, and the substrate 11 may be formed of any of various materials including ceramic, transparent plastic materials, and metals. In embodiments where the organic light emitting display device 100 is a top emission type in which light is emitted in a direction opposite to the substrate 11, the substrate 11 may be opaque, and thus the substrate 11 may not only be a glass substrate or a plastic substrate, but also be a metal substrate or a carbon fiber substrate. In embodiments where the organic light emitting display device 100 is a flexible display device, the substrate 11 may be a bendable flexible substrate formed of a polyimide film, for example.

In some embodiments, the organic light emitting unit 13 may be arranged on the substrate 11. In some embodiments, the organic light emitting unit 13 may have a structure in which a first electrode 13a, an organic light emitting layer 13b, and a second electrode 13c are stacked on the substrate 11 in the order stated.

In some embodiments, the first electrode 13a and the second electrode 13c may respectively function as an anode and a cathode or vice versa.

In some embodiments, the first electrode 13*a* may be arranged on the substrate 11, where edges of the first electrode 13*a* may be covered by a pixel defining layer 13*d*. If the first electrode 13*a* is an anode, the first electrode 13*a* may be formed of one from among materials having high work functions for easy hole injection. According to type of the organic light emitting display device 100, the first electrode 13*a* may be a reflective electrode, a semi-transmissive electrode, or a transmissive electrode. In some embodiments, the first electrode 13*a* may be formed of a transparent material having excellent conductivity, e.g., indium tin oxide (ITO), indium zinc oxide (IZO), tin oxide ($SnO_2$), zinc oxide (ZnO), $In_2O_3$, etc. When the first electrode 13*a* is formed as a reflective electrode, the first electrode 13*a* may include a reflective layer, which may be formed of Ag, Mg, Al, Pt, Pd, Au, Ni, Nd, Tr, Cr, or a compound thereof, and a transparent layer, which is formed of ITO, IZO, ZnO, or $In_2O_3$. In some embodiments, the first electrode 13*a* may have a single-layer structure or a multi-layer structure including two or more layers. For example, the first electrode 13*a* may have a triple layer structure of ITO/Ag/ITO. However, the present disclosure is not limited thereto.

In some embodiments, the organic light emitting layer 13*b* is arranged on the first electrode 13*a* and/or the pixel defining layer 13*d*. In some embodiments, the organic light emitting layer 13*b* may be formed of a monomer organic material or a polymer organic material. If the organic light emitting layer 13*b* is formed of a monomer organic material, a hole injection layer (not shown), a hole transport layer (not shown) an electron transport layer (not shown), and an electron injection layer (not shown) may be stacked around the organic light emitting layer 13*b* and form a single structure or a composite structure, where the monomer organic material may be copper phthalocyanine (CuPC), N,N'-di(naphthalene-1-yl)-N, N'-diphenyl-benzidine (NPB), tris-8-hydroxyquinoline aluminum ($Alq_3$), etc. In some embodiments, the monomer organic materials may be formed via vacuum deposition using masks.

If the organic light emitting layer 13*b* is formed of a polymer organic material, a hole transport layer (not shown) may be further formed on the organic light emitting layer 13*b* toward an anode electrode, where the hole transport layer may be formed of PEDOT, and the organic light emitting layer 13*b* may be formed of a polymer organic material, such as a poly-phenylenevinylene (PPV) based material or a polyfluorene-based material.

For example, the organic light emitting layer 13*b* may include one or more from among compounds 301, 311 and 321 as shown below.

Chemical Formula 1

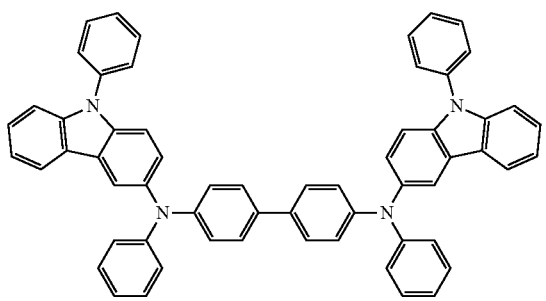

301

Chemical Formula 2

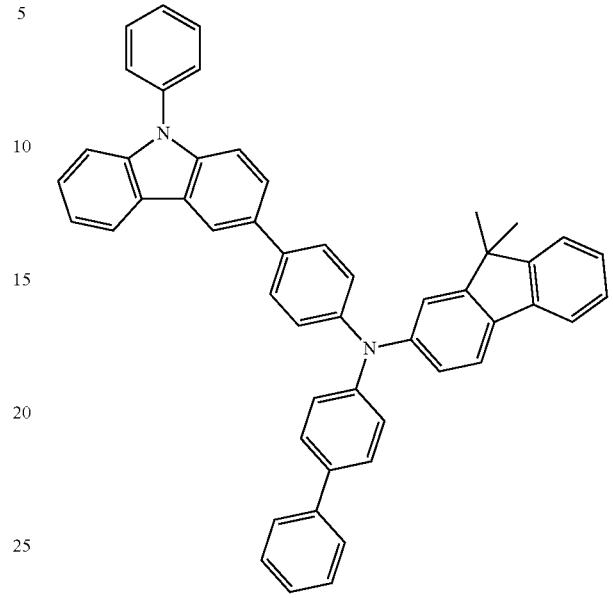

311

Chemical Formula 3

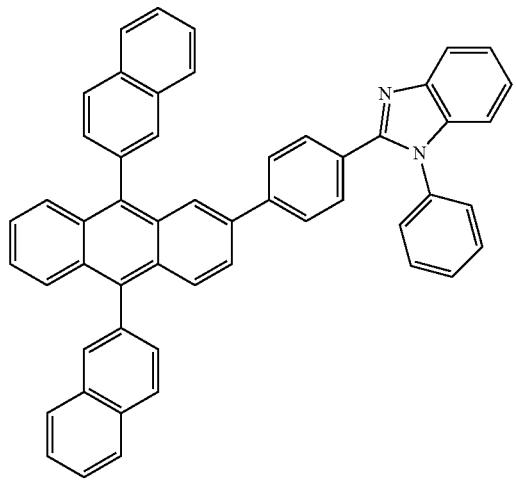

321

In some embodiments, the organic light emitting layer 13*b* may include the organic light emitting layers 13*b* respectively emitting red light, green light, and blue light at a space defined by the pixel defining layer 13*d* and constitute sub-pixels. Furthermore, the sub-pixels respectively emitting red light, green light, and blue light may constitute a unit pixel. However, the present embodiments are not limited thereto, and the organic light emitting layer 13*b* may be formed throughout the entire organic light emitting unit 13 regardless of locations of pixels. In this case, the organic light emitting layer 13*b* may be formed either by vertically stacking layers containing light emitting materials emitting red light, green light, and blue light or by mixing the layers containing the light emitting materials emitting red light, green light, and blue light. In some embodiments, different color combination may be embodied if a layer is capable of emitting white light. Furthermore, a color converting layer or a color filter for converting the emitted white light to light of a predetermined color may be further arranged.

In some embodiments, the second electrode 13c is arranged on the top of the organic light emitting layer 13b and is electrically insulated from the first electrode 13a by the organic light emitting layer 13b. In some embodiments, the second electrode 13c may be a cathode, which is an electron injection electrode. In this case, the second electrode 13c may be formed of a metal, an alloy, an electroconductive compound, or a mixture thereof, having a low work function. For example, a reflective electrode, a semi-transmissive electrode, or a transmissive electrode may be formed by forming a thin-film of lithium (Li), magnesium (Mg), aluminum (Al), aluminum-lithium (Al—Li), calcium (Ca), magnesium-indium (Mg—In), magnesium-silver (Mg—Ag), etc. Various modifications may be made therein, e.g., a transmissive electrode may be formed of ITO or IZO to obtain a top emission type electrode.

Although not shown in FIG. 1, the organic light emitting unit 13 may include one pixel circuit per pixel, and the pixel circuit may include at least one thin-film transistor (TFT) (not shown) and a capacitor (not shown). In some embodiments, the first electrode 13a may be electrically connected to the TFT and be driven.

In some embodiments, the first electrode 13a may be patterned in each pixel, whereas the second electrode 13c may be formed as a common electrode to cover all pixels.

If the organic light emitting display device 100 is a bottom emission type in which an image is embodied toward the substrate 11, light emission efficiency toward the substrate 11 may be improved by forming the second electrode 13c to have a relatively large thickness.

If the organic light emitting display device 100 is a top emission type in which an image is embodied toward the second electrode 13c, the second electrode 13c may be formed to have a sufficiently small thickness to become a semi-transmissive reflective film or may be formed of a transparent conductor other than the materials stated above. In this case, a reflective film may further be arranged on the first electrode 13a.

In some embodiments, the inorganic layer 14 may prevent permeation of external moisture or oxygen into the organic light emitting unit 13. In other words, the inorganic layer 14 may encapsulate the organic light emitting unit 13 from external environments.

In some embodiments, the inorganic layer 14 may include a lower temperature viscosity transition (LVT) inorganic material (referred to hereinafter as 'LVT inorganic material'). In some embodiments, the LVT inorganic material may be an inorganic material having a low viscosity transition temperature.

Here, the "viscosity transition temperature" does not refer to a temperature at which viscosity of the LVT inorganic material is completely changed from solid to liquid, but refers to the lowest temperature at which the LVT inorganic material obtains fluidity.

As described below, the LVT inorganic material may be formed by being coagulated after being fluidized, where the viscosity transition temperature of the LVT inorganic material may be lower than denaturation of a material included in the organic light emitting unit 13.

The denaturation temperature refers to a temperature at which chemical and/or physical denaturation of a material included in the organic light-emitting unit 13 may be induced. For example, the "denaturation temperature of the material included in the organic light-emitting unit 13" may refer to the glass transition temperature Tg of an organic material included in the organic layer 13b of the organic light-emitting unit 13. In some embodiments, the glass transition temperature Tg may be obtained based on a result of performing a thermal analysis using a thermo gravimetric analysis (TGA) and differential scanning calorimetry (DSC) ($N_2$ atmosphere, Temperature Range: room temperature ~600° C. (10° C./min) (TGA) and room temperature ~400° C. (DSC), Pan Type: Pt Pan in disposable Al Pan (TGA) and disposable pan (DSC)).

In some embodiments, the denaturation temperature of the material included in the organic light-emitting unit 13 may exceed about 130° C., for example. However, the present embodiments are not limited thereto, and the denaturation temperature of the material included in the organic light-emitting unit 13 may be easily measured via the TGA analysis as described above.

For example, the temperature for viscosity transition of the LVT inorganic material may be about 80° C. or higher, e.g., from about 80° C. to 130° C. However, the present embodiments are not limited thereto. For example, the temperature for viscosity transition of the LVT inorganic material may be from about 80° C. to 120° C. or from about 100° C. to 120° C. However, the present embodiments are not limited thereto.

In some embodiments, the LVT inorganic material may include one compound or be a mixture of two or more compounds.

In some embodiments, the LVT inorganic material may include a tin oxide (e.g., SnO or $SnO_2$).

If the LVT inorganic material includes SnO, content of the SnO may be from 20 weight % to 100 weight %.

For example, the LVT inorganic material may further include one or more from among a phosphorus oxide (e.g., $P_2O_5$), boron phosphate ($BPO_4$), a tin fluoride (e.g., $SnF_2$), a niobium oxide (e.g., NbO), and a tungsten oxide (e.g., $WO_3$). However, the present embodiments are not limited thereto.

For example, the LVT inorganic material may include
SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$. However, the present embodiments are not limited thereto.

For example, the LVT inorganic material may include one from among compositions stated below. However, the present embodiments are not limited thereto.

1) SnO (100 wt %);
2) SnO (80 wt %), and $P_2O_5$ (20 wt %);
3) SnO (90 wt %), and $BPO_4$ (10 wt %);
4) SnO (20-50 wt %), $SnF_2$ (30-60 wt %), and $P_2O_5$ (10-30 wt %) (here, the sum of weights of SnO, $SnF_2$, and $P_2O_5$ is 100 wt %);
5) SnO (20-50 wt %), $SnF_2$ (30-60 wt %), $P_2O_5$ (10-30 wt %), and NbO (1-5 wt %) (here, the sum of weights of SnO, $SnF_2$, $P_2O_5$, and NbO is 100 wt %); or
6) SnO (20-50 wt %), $SnF_2$ (30-60 wt %), $P_2O_5$ (10-30 wt %), and $WO_3$ (1-5 wt %) (here, the sum of weights of SnO, $SnF_2$, $P_2O_5$, and $WO_3$ is 100 wt %).

For example, the LVT inorganic material may include SnO (42.5 wt %), $SnF_2$ (40 wt %), $P_2O_5$ (15 wt %), and $WO_3$ (2.5 wt %). However, the present embodiments are not limited thereto.

When the inorganic layer 14 is formed to have the composition, the viscosity transition temperature may be maintained to be lower than the denaturation temperature of the organic light emitting unit 13, and thus various defects that may formed in the inorganic layer 14 may be healed during an operation for healing the inorganic layer 14 as described below.

In some embodiments, the thickness of the inorganic layer 14 may be from about 1 μm to about 30 μm, e.g., from about 1 μm to about 5 μm. Here, if the thickness of the inorganic layer 14 is from about 1 μm to about 5 μm, a bendable flexible organic light emitting display apparatus may be embodied.

In some embodiments, the adhesive layer 15 may be arranged between the organic light emitting unit 13 and the inorganic layer 14. In some embodiments, the adhesive layer 15 may be a layer for compensating stress that may be formed between the organic light emitting unit 13 and the inorganic layer 14.

In some embodiments, the inorganic layer 14 including the LVT inorganic material becomes a dense thin-film during the restoring operation described below. Here, due to force applied to another layer contacting the inorganic layer 14, e.g., the second electrode 13c of the organic light emitting unit 13, the second electrode 13c may be peeled off. In some embodiments, the adhesive layer 15 may be a layer for protecting the second electrode 13c from stress applied by the inorganic layer 14 and preventing the second electrode 13c from being peeled off. However, the present embodiment are not limited thereto. If there is another layer, such as a protection layer (not shown), on the second electrode 13c, the adhesive layer 15 may be a layer for preventing the protection layer from being peeled off. Furthermore, the adhesive layer 15 may prevent cracks that may be formed between layers.

restoring coefficient of thermal expansion (CTE) of the adhesive layer 15 may be smaller than the CTE of the inorganic layer 14. Generally, it is known that CTE of the LVT inorganic material is greater than the CTE of the organic light emitting unit 13. In some embodiments, the CTE of the adhesive layer 15 may be greater than or equal to the CTE of the organic light emitting unit 13 and may be smaller than the CTE of the inorganic layer 14. In this case, the adhesive layer 15 may compensate stress between thin-films due to change of temperature.

In some embodiments, the adhesive layer 15 may include a metal. In some embodiments, the adhesive layer 15 may include a soft material. In some embodiments, the adhesive layer 15 may include at least one metal selected from a group consisting of Au, Pt, Ag, Fe, Cu, Al, Y, and $Y_2O_3$. In some embodiments, the adhesive layer 15 may be formed as a single layer or multiple layers.

In some embodiments, the adhesive layer 15 may be formed as a uniform layer completely covering the organic light emitting unit 13. If the organic light emitting display device 100 is a top emission type, the adhesive layer 15 may be formed as a thin film having a thickness of several nm to not to deteriorate light transmission. In some embodiments, the thickness of the adhesive layer 15 may be from about 3 nm to about 7 nm.

In some embodiments, the adhesive layer 15 may have a thickness from dozens of nm to several um if the organic light emitting display device 100 is a bottom emission type. In some embodiments, the adhesive layer 15 may also function as a reflective film. In some embodiments, the thickness of the adhesive layer 15 may be 20 nm or greater.

Figure 2:
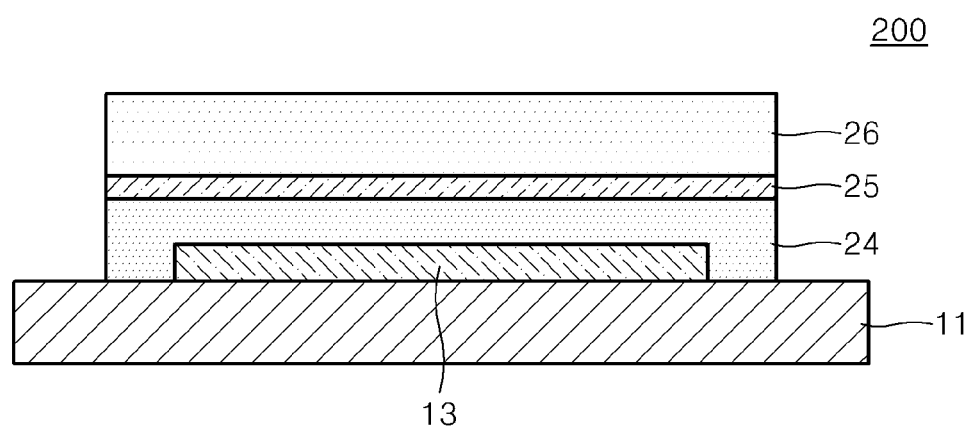
FIG. 2 is a schematic sectional view of an organic light emitting display device according to another embodiment.

FIG. 2 is a schematic sectional view of an organic light emitting display device 200 according to another embodiment. In FIG. 2, the same reference numerals as in FIG. 1 denote the same elements in FIG. 1. For simplification of explanation, detailed descriptions thereof will be omitted.

Referring to FIG. 2, compared to the organic light emitting display device 100 of FIG. 1, an adhesive layer 25 is arranged between a first inorganic layer 24 and a second inorganic layer 26 in the organic light emitting display device 200.

The adhesive layer 25 is arranged between the organic light emitting unit 13 and the second inorganic layer 26, where the first inorganic layer 24 is further arranged below the adhesive layer 25. In some embodiments, the adhesive layer 25 may be a layer for relieving stress that may be formed between the first inorganic layer 24 and the second inorganic layer 26. In some embodiments, the adhesive layer 25 may be formed of the same material and has the same structure as the adhesive layer 15 of FIG. 1.

In some embodiments, the thickness of the adhesive layer 25 may be from about 3 nm to about 7 nm. In some embodiments, the adhesive layer 25 may be phototransmissive. Although not shown in FIG. 2, the adhesive layer (15; refer to FIG. 1A) of FIG. 1A may be further arranged between the organic light emitting unit 13 and the first inorganic layer 24.

In some embodiments, the first inorganic layer 24 and the second inorganic layer 26 may include a LVT inorganic material. In some embodiments, the LVT inorganic material may be as described above with reference to FIGS. 1A and 1B. In some embodiments, the first inorganic layer 24 and the second inorganic layer 26 may be formed of a same material. However, the present embodiments are not limited thereto, and the first inorganic layer 24 and the second inorganic layer 26 may be formed of different materials. In some embodiments, the first inorganic layer 24 may contain $SnO_2$, whereas the second inorganic layer 26 may contain SnO. In some embodiments, the combined thickness of the first inorganic layer 24 and the second inorganic layer 26 may be several μm, e.g., from about 2 μm to about 5 μm. In some embodiments, the thickness of the first inorganic layer 24 may be smaller than or equal to 1.5 μm, whereas the thickness of the second inorganic layer 26 may be from about 0.5 μm to about 2 μm. However, the present embodiments are not limited thereto.

In some embodiments, the first inorganic layer 24 and the second inorganic layer 26 may prevent permeation of external moisture or oxygen into the organic light emitting unit 13. In some embodiments, the first inorganic layer 24 and the second inorganic layer 26 may encapsulate the organic light emitting unit 13 from external environments. In some embodiments—the first inorganic layer 24 may prevent the second electrode 13c from being oxidized. In some embodiments, the first inorganic layer 24 may become a dense thin-film during the healing operation described below.

FIGS. 3A through 3D are diagrams sequentially showing a method of manufacturing the organic light emitting display device as shown in FIG. 2, according to an embodiment.

Figure 3A:
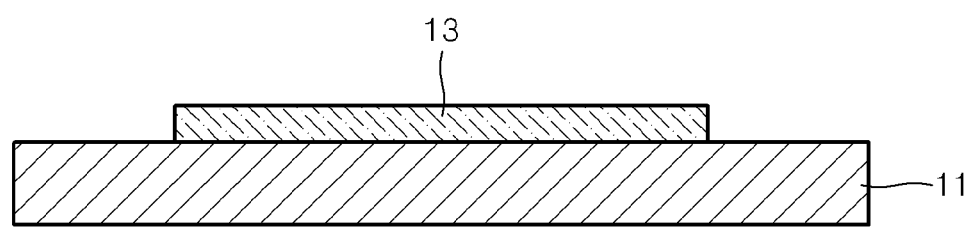
FIGS. 3A through 3E are diagrams sequentially showing a method of manufacturing the organic light emitting display device as shown in FIG. 2, according to an embodiment.

Referring to FIG. 3A, the organic light emitting unit 13 is formed on the substrate 11. As in FIG. 1B, the organic light emitting unit 13 has the structure in which the first electrode 13a, the organic light emitting layer 13b, and the second electrode 13c are stacked on the substrate 11 in the order stated.

In some embodiments, the first electrode 13a may be formed via any of various deposition methods. In some embodiments, the first electrode 13a may be formed in each of pixels. Next, the pixel defining layer 13d may be formed to cover the first electrode 13a. In some embodiments, the pixel defining layer 13d may include polyacrylate-based or polyimide-based resin and silica-based inorganic materials. After a predetermined opening is formed in the pixel defining layer 13d, the organic light emitting layer 13b is formed in a region defined by the opening. Next, the second electrode 13c may be formed to cover all pixels. In some embodiments, a protection layer (not shown) may be further formed on the second electrode 13c.

Figure 3B:
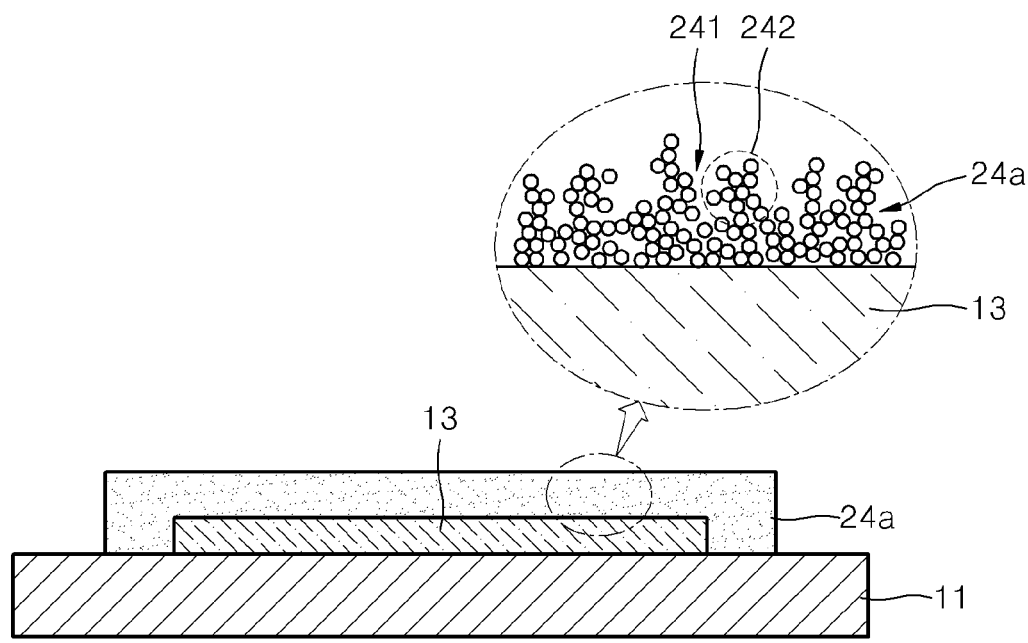

Referring to FIG. 3B, a first pre-inorganic layer 24a may be formed on the organic light emitting unit 13. In some embodiments, the first pre-inorganic layer 24a may be formed via thermal evaporation, sputtering, vacuum deposition, cold deposition, electron beam coating, ion plating, or a combination thereof.

In some embodiments, the first pre-inorganic layer 24a may be formed via plasma chemical vapor deposition (PCVD) or plasma ion assisted deposition (PIAD). In some embodiments, the first pre-inorganic layer 24a may be formed by providing a LVT inorganic material onto the organic light emitting unit 13 via dual rotary target sputtering. In some embodiments, when the first pre-inorganic layer 24a is formed, scanning may be performed while the substrate 11 is moving. In some embodiments, when the first pre-inorganic layer 24a is formed, composition of the LVT inorganic material may be changed by controlling injecting amount of oxygen.

In some embodiments, the first pre-inorganic layer 24a may include defects, such as a film forming element and a pin hole 241. In some embodiments, the LVT inorganic material film forming element 242 refers to condensed LVT inorganic material particles that did not contribute to formation of a LVT inorganic material film formation, whereas the pin hole 241 refers to an empty region due to absence of the LVT inorganic material. In some embodiments, the formation of the LVT inorganic material film forming element 242 may contribute to the formation of the pin hole 241.

In some embodiments, the defects of the first pre-inorganic layer 24a as described above may become paths in which external environmental substances, such as moisture and oxygen, pass during storage and driving of an organic light emitting display device, thereby causing progressive dark spots. Therefore, lifespan of an organic light emitting display apparatus may be deteriorated.

Figure 3C:
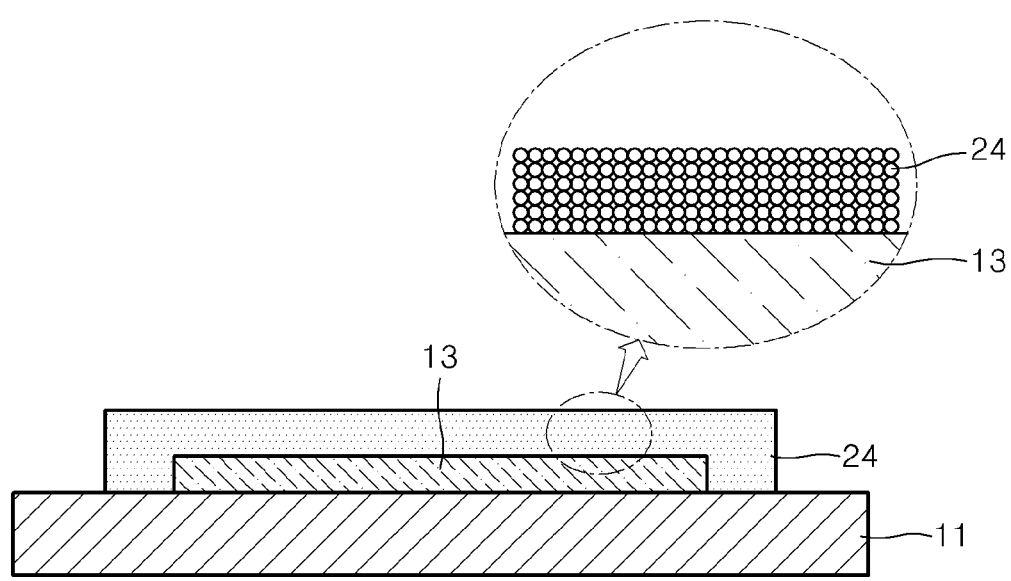

Therefore, after the first pre-inorganic layer 24a is formed as shown in FIG. 3C, a restoring operation for removing defects of the first pre-inorganic layer 24a is performed.

In some embodiments, the restoring operation is performed at a temperature equal to or higher than the temperature for viscosity transition of the LVT inorganic material included in the first pre-inorganic layer 24a. In some embodiments, the restoring operation may be performed at a temperature at which the organic light emitting unit 13 is not damaged. For example, the restoring operation may be performed by thermally treating the first pre-inorganic layer 24a at a temperature that is equal to or higher than the temperature for viscosity transition of the LVT inorganic material and lower than the denaturation temperature of a material included in the organic light-emitting unit 13. The "temperature for viscosity transition of the LVT inorganic material" varies according to compositions of the LVT inorganic material, and the "denaturation temperature of the material included in the organic light-emitting unit 13" varies according to the material included in the organic light-emitting unit 13. However, the temperatures stated above are appropriate based on the composition of the LVT inorganic material and the material included in the organic light-emitting unit 13 (e.g., Tg temperature evaluation based on TGA analysis on the material included in the organic light-emitting unit 13).

In some embodiments, the restoring operation may be performed by thermally treating the first pre-inorganic layer 24a at a temperature from about 80° C. to about 130° C. for from about 1 hour to about 3 hours (e.g., at 110° C. for 2 hours). However, the present embodiments are not limited thereto. By performing the restoring operation at a temperature within the range as described above, the LVT inorganic material of the first pre-inorganic layer 24a may be fluidized and denaturation of the organic light-emitting unit 13 may be prevented.

In some embodiments, the restoring operation may be performed in an IR oven under vacuum atmosphere or inert gas atmosphere (e.g., $N_2$ atmosphere, Ar atmosphere, etc.).

Due to the restoring operation, the LVT inorganic material included in the first pre-inorganic layer 24a may be fluidized. In some embodiments, the fluidized LVT inorganic material may have flowability. Therefore, during the restoring operation, the fluidized LVT inorganic material may flow into the pin hole 241 of the first pre-inorganic layer 24a and fill the pin hole 241, and the LVT inorganic material film forming element 242 may be fluidized, flow into the pin hole 241, and fill the pin hole 241. The fluidized LVT inorganic material may be solidified again as temperature drops after the thermal treatment.

As a result, defects of the first pre-inorganic layer 24a may be removed, and thus the dense first inorganic layer 24 may be formed.

Figure 3D:
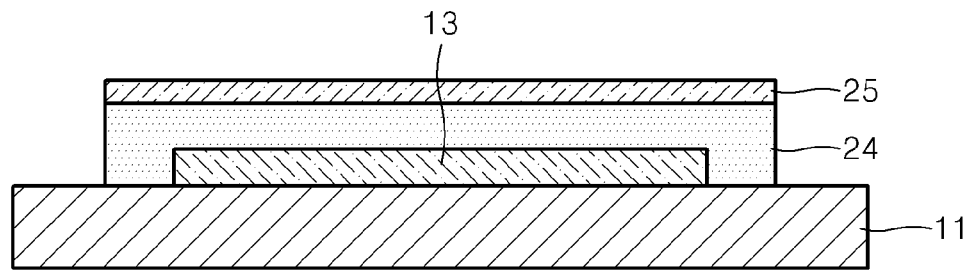

Referring to FIG. 3D, the adhesive layer 25 may be formed on the first inorganic layer 24. In some embodiments, the adhesive layer 25 may be formed via thermal evaporation, sputtering, vacuum deposition, cold deposition, electron beam coating, or ion plating.

Figure 3E:
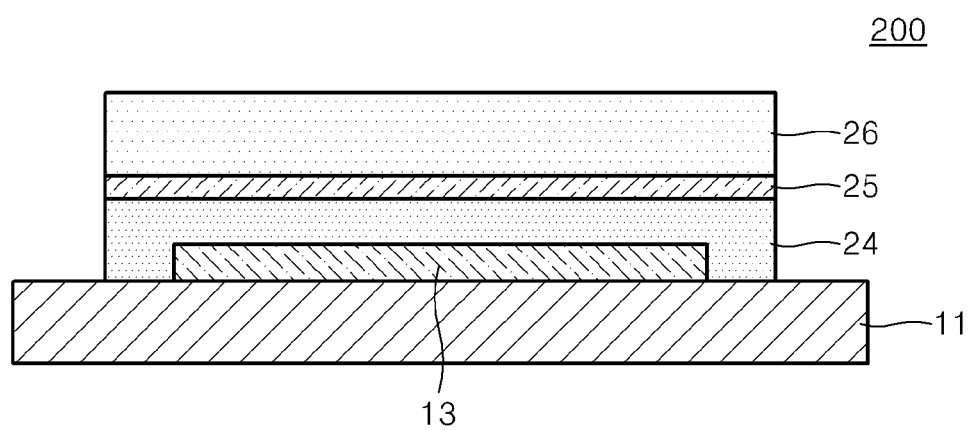

Referring to FIG. 3E, the second inorganic layer 26 may be formed on the adhesive layer 25. In some embodiments, the second inorganic layer 26 may be formed using a method similar to or same as the method for forming the first inorganic layer 24 described above with reference to FIGS. 3B and 3C. In some embodiments, the second inorganic layer 26 may be formed to have a dense structure by forming a second pre-inorganic layer (not shown) on the adhesive layer 25 and performing a healing operation thereto.

The method of manufacturing the organic light emitting display device 200 described above is merely an example, and various modifications may be made therein. For example, while the organic light emitting display device 200 is being manufactured, the first pre-inorganic layer 24a, the adhesive layer 25, and the second pre-inorganic layer may be formed in the order stated, and then the first pre-inorganic layer 24a and the second pre-inorganic layer may be restored at once.

Figure 4:
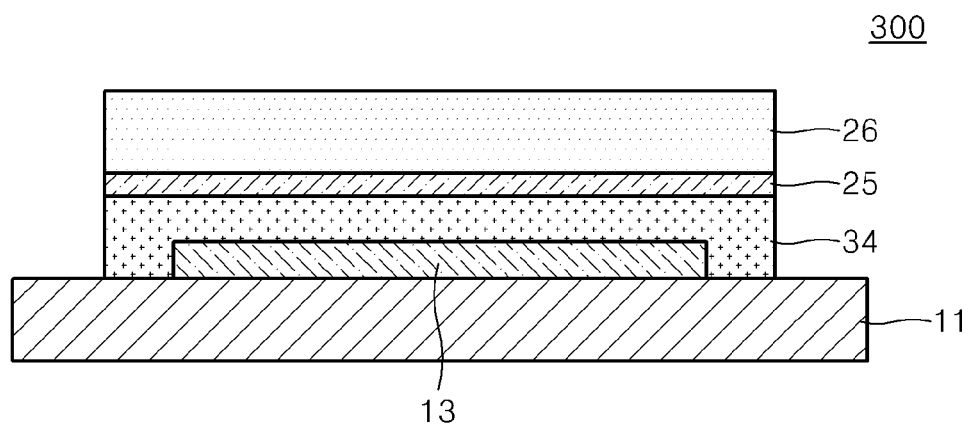
FIG. 4 is a schematic sectional view of an organic light emitting display device according to another embodiment.

FIG. 4 is a schematic sectional view of an organic light emitting display device 300 according to another embodiment. In FIG. 4, the same reference numerals as in FIG. 2 denote the same elements in FIG. 2. For simplification of explanation, detailed descriptions thereof will be omitted.

Referring to FIG. 4, a barrier layer 34 is interposed between the organic light emitting unit 13 and the adhesive layer 25 in the organic light emitting display device 300, unlike the organic light emitting display device 200 shown in FIG. 2.

In some embodiments, the barrier layer 34 may be a layer for preventing introduction of moisture and oxygen into the organic light-emitting unit 13. In some embodiments, the barrier layer 34 may be formed of an inorganic layer including a nitride or an oxide. In some embodiments, the barrier layer 34 may include at least one from among $SiO_x$ ($1 \leq x \leq 2$), $Al_2O_3$, zinc tin oxide (ZTO), Ga-doped zinc oxide (GZO), Al-doped zinc oxide (AZO), silicon oxynitride (SiON), and $SiN_x$ ($1 \leq x \leq 2$).

In some embodiments, the barrier layer 34 may be formed via thermal evaporation, sputtering, vacuum deposition, cold deposition, electron beam coating, or ion plating.

Meanwhile, if the second inorganic layer 26 including the LVT inorganic material is formed directly on the barrier layer 34, stress is formed between dense inorganic layers, and thus the interface therebetween may be peeled off or cracked. In some embodiments, the adhesive layer 25 may reduce stress between the barrier layer 34 and the second inorganic layer 26 including the LVT inorganic material.

Figure 5:
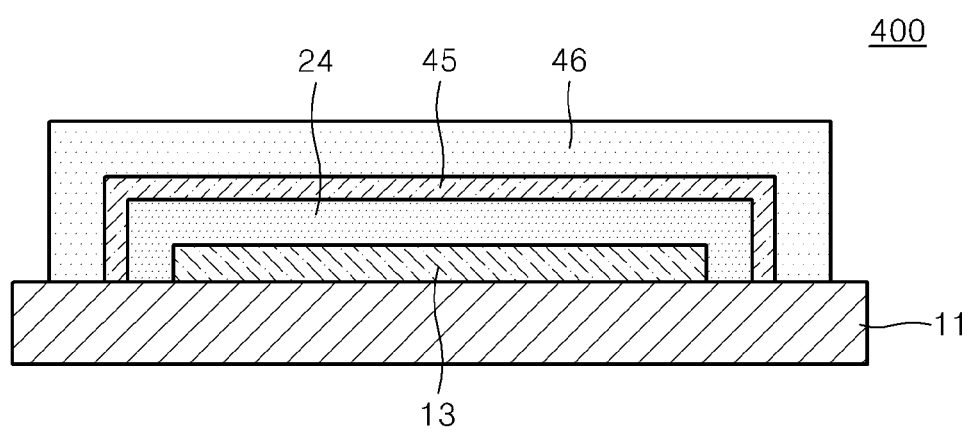
FIG. 5 is a schematic sectional view of an organic light emitting display device according to another embodiment.

FIG. 5 is a schematic sectional view of an organic light emitting display device 400 according to another embodiment of the present invention. In FIG. 5, the same reference numerals as in FIG. 2 denote the same elements in FIG. 2. For simplification of explanation, detailed descriptions thereof will be omitted.

Referring to FIG. 5, unlike the organic light emitting display device 200 shown in FIG. 2, an adhesive layer 45 and a second inorganic layer 46 are arranged to surround side surfaces of the first inorganic layer 24 in the organic light emitting display device 400. Functions and configurations of the adhesive layer 45 and the second inorganic layer 46 are identical to those of the adhesive layer 25 and the second inorganic layer 26 described above with reference to FIG. 2. In some embodiments, the arrangement of the adhesive layer 45 and the second inorganic layer 46 on the top surface and the side surfaces of the first inorganic layer 24, improves adhesiveness and barrier characteristics regarding the side surfaces.

Figure 6:
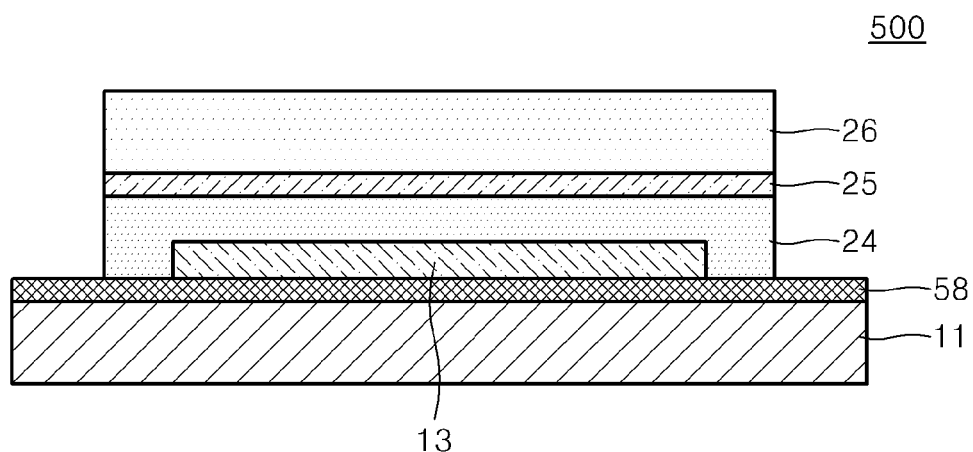
FIG. 6 is a schematic sectional view of an organic light emitting display device according to another embodiment.

FIG. 6 is a schematic sectional view of an organic light emitting display device 500 according to another embodiment. In FIG. 6, the same reference numerals as in FIG. 2 denote the same elements in FIG. 2. For simplification of explanation, detailed descriptions thereof will be omitted.

Referring to FIG. 6, unlike the organic light emitting display device 200 shown in FIG. 2, a third inorganic layer 58 is arranged between the substrate 11 and the organic light emitting unit 13 in the organic light emitting display device 500.

In some embodiments, the third inorganic layer 58 may be formed of the LVT inorganic material and be healed. Although not shown, a pixel circuit unit including a TFT and/or a capacitor may be arranged on the third inorganic layer 58. In some embodiments, the encapsulation characteristic of the organic light emitting unit 13 may be further improved due to the dense barrier characteristic of the third inorganic layer 58. In some embodiments, the third inorganic layer 58 may be useful when barrier characteristic of the substrate 11 is not satisfactory, e.g., when the substrate 11 is formed of a plastic.

Figure 7:
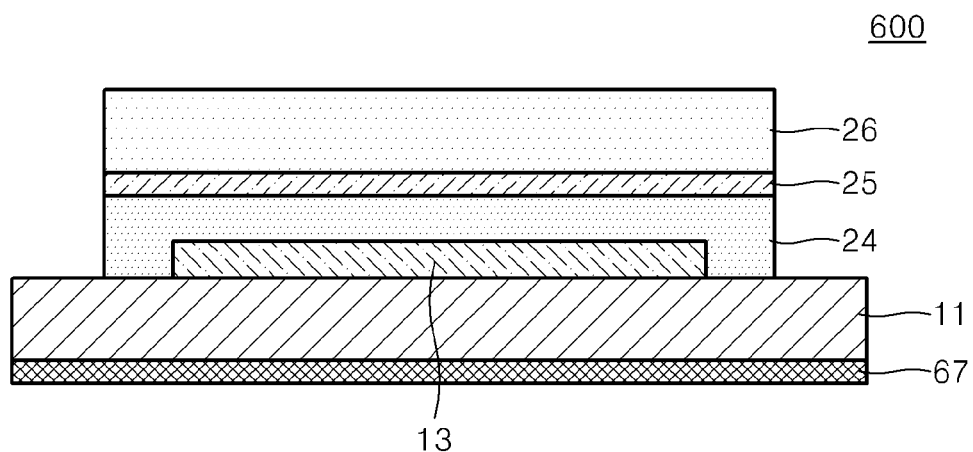
FIG. 7 is a schematic sectional view of an organic light emitting display device according to another embodiment.

FIG. 7 is a schematic sectional view of an organic light emitting display device 600 according to another embodiment of the present invention. In FIG. 7, the same reference numerals as in FIG. 2 denote the same elements in FIG. 2. For simplification of explanation, detailed descriptions thereof will be omitted.

Referring to FIG. 7, unlike the organic light emitting display device 200 shown in FIG. 2, a rear organic layer 67 is formed on the rear surface of the substrate 11 in the organic light emitting display device 600.

In some embodiments, the rear organic layer 67 may improve bending characteristic and/or mechanical strength of the substrate 11. If the substrate 11 is formed of a glass material, the substrate 11 may have unsatisfactory bending characteristic, even if thickness of the substrate 11 is small. In this case, arranging the rear organic layer 67 on the rear surface of the substrate 11 may improve the bending characteristic of the substrate 11. For example, bending radius of a glass substrate having a thickness of 0.1 mm is around 10 cm. However, if the rear surface of the glass substrate is coated with an acrylic organic layer having a thickness of 0.5 µm, the glass substrate won't be broken even if the glass substrate is bent 10,000 times at a bending radium around 2 cm.

Although the descriptions given above are regarding cases in which display devices are the organic light emitting display devices 100, 200, 300, 400, 500, and 600 including organic light emitting devices, the present invention may be applied to flat-panel display devices having different structures employing inorganic encapsulating thin-films.

Furthermore, although not shown, an organic layer formed of an organic material and an inorganic layer formed of an inorganic material may be alternately arranged on the inorganic layer 14 and the second inorganic layer 26 of FIGS. 1 and 2 through 7 and constitute a thin-film encapsulating structure. In this case, the organic layer may be formed of a polymer material and may be a single layer or multi layers including one or more from among polyethylene terephthalate, polyimide, polycarbonate, epoxy, polyethylene, and polyacrylate. In the encapsulating structure, the topmost layer of the encapsulating structure exposed to outside may be formed as an inorganic layer to prevent permeation into an organic light emitting device. In some embodiments, the encapsulating structure may include at least one sandwiched structure in which at least one organic layer is arranged between at least two inorganic layers. Furthermore, the thin-film encapsulating structure may also include at least one sandwiched structure in which at least one inorganic layer is arranged between at least two organic layers.

While the present embodiments have been particularly shown and described with reference to exemplary embodiments thereof, it will be understood by those of ordinary skill in the art that various changes in form and details may be made therein without departing from the spirit and scope of the claims.

What is claimed is:

1. An organic light emitting display device comprising:
   a substrate;
   an organic light emitting unit on the substrate;
   at least one inorganic layer, which encapsulates the organic light emitting unit and contains a low temperature viscosity transition (LVT) inorganic material; and
   at least one adhesive layer between the organic light emitting unit and the inorganic layer, wherein the adhesive layer comprises a metal.

2. The organic light emitting display device of claim 1, wherein coefficient of thermal expansion (CTE) of the adhesive layer is smaller than CTE of the inorganic layer.

3. The organic light emitting display device of claim 1, wherein the adhesive layer comprises at least one selected from a group comprising of Au, Pt, Ag, Fe, Cu, Al, Y, and $Y_2O_3$.

4. The organic light emitting display device of claim 1, wherein thickness of the adhesive layer is from about 3 nm to about 7 nm.

5. The organic light emitting display device of claim 1, wherein the LVT inorganic material comprises a tin oxide.

6. The organic light emitting display device of claim 1, wherein the LVT inorganic material comprises a tin oxide and further comprises at least one selected from among a phosphorus oxide, boron phosphate, a tin fluoride, a niobium oxide, and a tungsten oxide.

7. The organic light emitting display device of claim 1, wherein the LVT inorganic material comprises SnO and further comprises at least one selected from among $P_2O_5$, $BPO_4$, $SnF_2$, NbO, or $WO_3$.

8. The organic light emitting display device of claim 1, wherein viscosity transition temperature of the LVT inorganic material included in the inorganic layer is lower than denaturation temperature of the organic light emitting unit.

9. The organic light emitting display device of claim 1, further comprising a barrier layer between the organic light emitting unit and the adhesive layer.

10. The organic light emitting display device of claim 9, wherein the barrier layer comprises at least one of an oxide or a nitride.

11. The organic light emitting display device of claim 9, wherein the barrier layer comprises at least one selected from a group consisting of $SiO_x$ ($1 \leq x \leq 2$), $Al_2O_3$, zinc tin oxide (ZTO), Ga-doped zinc oxide (GZO), Al-doped zinc oxide (AZO), silicon oxynitride (SiON), and $SiN_x$ ($1 \leq x \leq 2$).

12. An organic light emitting display device comprising:
a substrate;
a organic light emitting unit on the substrate;
a first inorganic layer, which covers the organic light emitting unit and includes a first low temperature viscosity transition (LVT) inorganic material;
a second inorganic layer, which is arranged on the first inorganic layer and includes a second LVT inorganic material; and
an adhesive layer arranged between the first inorganic layer and the second inorganic layer, wherein the adhesive layer comprises a metal.

13. The organic light emitting display device of claim 12, wherein thickness of the adhesive layer is from about 3 nm to about 7 nm.

14. The organic light emitting display device of claim 12, wherein the first LVT inorganic material comprises $SnO_2$, and
the second LVT inorganic material comprises SnO.

15. The organic light emitting display device of claim 12, wherein viscosity transition temperatures of the first LVT inorganic material and the second LVT inorganic material are lower than denaturation temperature of the organic light emitting unit.

* * * * *